United States Patent [19]
Sudo et al.

[11] Patent Number: 5,659,503
[45] Date of Patent: Aug. 19, 1997

[54] NONVOLATILE SEMICONDUCTOR MEMORY HAVING AN IMPROVED REFERENCE VOLTAGE GENERATING CIRCUIT

[75] Inventors: Naoaki Sudo; Toshio Takeshima, both of Tokyo, Japan

[73] Assignee: NEC Corporation, Tokyo, Japan

[21] Appl. No.: 670,998

[22] Filed: Jun. 28, 1996

[30] Foreign Application Priority Data

Jun. 29, 1995 [JP] Japan .................................. 7-164341

[51] Int. Cl.$^6$ ........................................... G11C 11/34
[52] U.S. Cl. .......................... 365/185.2; 365/185.21; 365/189.07; 365/189.09; 365/210
[58] Field of Search ........................ 365/185.2, 185.21, 365/185.29, 189.07, 189.09, 210

[56] References Cited

U.S. PATENT DOCUMENTS

| | | | |
|---|---|---|---|
| 5,157,626 | 10/1992 | Watanabe | 365/185 |
| 5,268,869 | 12/1993 | Ferris et al. | 365/210 |
| 5,303,197 | 4/1994 | Miyashita | 365/210 |

FOREIGN PATENT DOCUMENTS

6-203585  7/1994  Japan.

Primary Examiner—David C. Nelms
Assistant Examiner—Hien Nguyen
Attorney, Agent, or Firm—Whitham, Curtis, Whitham & McGinn

[57] ABSTRACT

In a nonvolatile semiconductor memory, in addition to a first voltage generating circuit for supplying various voltages to memory cell transistors in various operations, there is provided a second voltage generating circuit for supplying various voltages to a dummy cell in a reference voltage generating circuit in the various operations. The second voltage generating circuit is configured to supply a dummy cell writing voltage to the dummy cell, one time only when the erase operation for the memory cell transistors has been carried out. Accordingly, with a very simple construction, the progress of the deterioration of the dummy cell and the memory cell transistor can be made close to each other, so that the working life of the nonvolatile semiconductor memory can be lengthened.

6 Claims, 6 Drawing Sheets

NONVOLATILE SEMICONDUCTOR MEMORY HAVING AN IMPROVED REFERENCE VOLTAGE GENERATING CIRCUIT

BACKGROUND OF THE INVENTION

1. Field of the Invention

The present invention relates to a nonvolatile semiconductor memory, and more specifically to a nonvolatile semiconductor memory having an improved circuit for generating a reference voltage used for a reading, by use of a dummy cell.

2. Description of Related Art

There has been known a nonvolatile semiconductor memory containing a number of memory cells arranged in the form of a matrix having a plurality of lows and a plurality of columns, each of the memory cells being formed of for example an electrically erasable programmable field effect transistor such as a floating gate field effect transistor so configured to have a threshold whose level can be electrically set. This field effect transistor will be called a "memory cell transistor" hereinafter.

For reading, in many cases, a voltage read from a designated memory cell transistor is compared with a reference voltage generated in a reference voltage generating circuit including a dummy cell, which has an on-resistance different from that of the memory cell transistor but which is the same as the memory cell transistor in the other characteristics, so that whether the data stored in the designated memory cell transistor is at a "1" level or at a "0" level, is discriminated on the basis of the result of the comparison.

Figure 1:
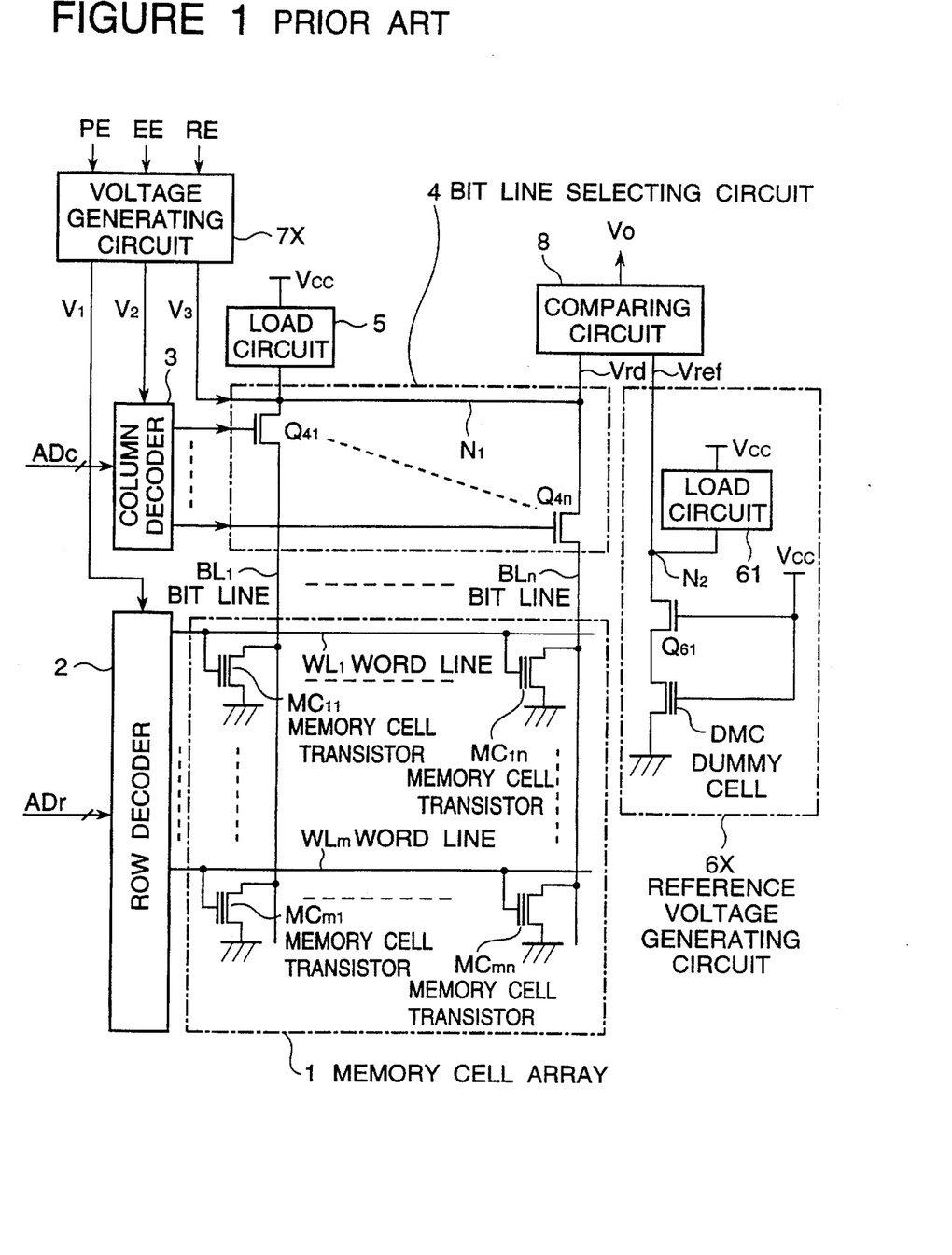
FIG. 1 is a circuit diagram of a first typical prior art example of the nonvolatile semiconductor memory.

Referring to FIG. 1, there is shown a circuit diagram of a first typical prior art example of the nonvolatile semiconductor memory.

The shown nonvolatile semiconductor memory includes a memory cell array 1 composed of a number of electrically erasable programmable memory cell transistors MC11 to MCmn arranged to form a matrix having a plurality of rows and a plurality of columns, a plurality of word lines WL1 to WLm each provided for a corresponding one of the rows of the memory cell transistors MC11 to MCmn and connected in common to a control gate of the memory cell transistors included in the corresponding row, and a plurality of bit lines BL1 to BLn each provided for a corresponding one of the columns of the memory cell transistors MC11 to MCmn and connected in common to a drain of the memory cell transistors included in the corresponding column. Sources of all the memory cell transistors MC11 to MCmn are connected to a common source line, which is connected to ground in the shown example.

The shown nonvolatile semiconductor memory further includes a row decoder 2 receiving a row address signal ADr in various operations including a write operation, an erase operation and a read operation, and also receiving a first predetermined voltage V1 which is different in the write operation, in the erase operation and in the read operation, for selecting from the plurality of word lines one word line in accordance with the received row address signal ADr and for supplying the received first predetermined voltage V1 to the selected word line, and a bit line selecting circuit 4 having a plurality of switching transistors Q41 to Q4n connected between the plurality of bit lines BL1 to BLn and a connection node N1, respectively, a load circuit 5 connected between the connection node N1 and a power supply voltage Vcc, and a column decoder 3 receiving a column address signal ADc and a second predetermined voltage V2 in the above mentioned various operations, for selectively supplying the received second predetermined voltage V2 to only one of the switching transistors Q41 to Q4n in accordance with the received column address signal ADc so as to turn on the selected only one switching transistor and to maintain the other switching transistors in an off condition, so that the power supply voltage Vcc supplied from the load circuit 5 is supplied through the selectively turned-on switching transistor to a bit line designated by the column address signal ADc.

Furthermore, the shown nonvolatile semiconductor memory includes a voltage generating circuit 7X receiving a write control signal PE, an erase control signal EE and a read control signal RE corresponding to the write operation, the erase operation and the read operation, respectively, for generating and supplying the first, second and third predetermined voltage V1, V2 and V3 which are determined in accordance with a designated operation, to the row decoder 2, the column decoder 3, and the connection node N1 of the bit line selection circuit 4, respectively.

The shown nonvolatile semiconductor memory also includes a reference voltage generating circuit 6X, which comprises a transistor Q61 and a dummy cell DMC connected in series between a second connection node N2 and the common source line, namely the Found in the shown example. The dummy cell DMC has the same characteristics as those of the memory cell transistors MC11 to MCmn, excepting that the dummy cell has an on-resistance different from that of the memory cell transistors MC11 to MCmn. A control gate of the dummy cell is connected to receive the power supply voltage Vcc. The transistor Q61 has a gate connected to receive the power supply voltage Vcc, and has the same characteristics as those of the switching transistors Q41 to Q4n. A load circuit 61 is connected between to the power supply voltage Vet and the connection node N2, for supplying the power supply voltage Vcc to the transistor Q61. Thus, at the connection node N2 between the load circuit 61 and the transistor Q61, a reference voltage Vref is generated, which is an intermediate level between a read-out level of the memory cell transistor (MC11 to MCmn) in an on condition and a read-out level of the memory cell transistor (MC11 to MCmn) in an off condition.

The shown nonvolatile semiconductor memory furthermore includes a comparing circuit 8 for comparing the reference voltage Vref with a signal level Vrd on the connection node N1, in the read operation.

Additionally, since the sources of the memory cell transistors MC11 to MCmn are connected to the ground, the voltage generating circuit 7X generates no voltage for the source of the memory cell transistors MC11 to MCmn.

Figure 2:
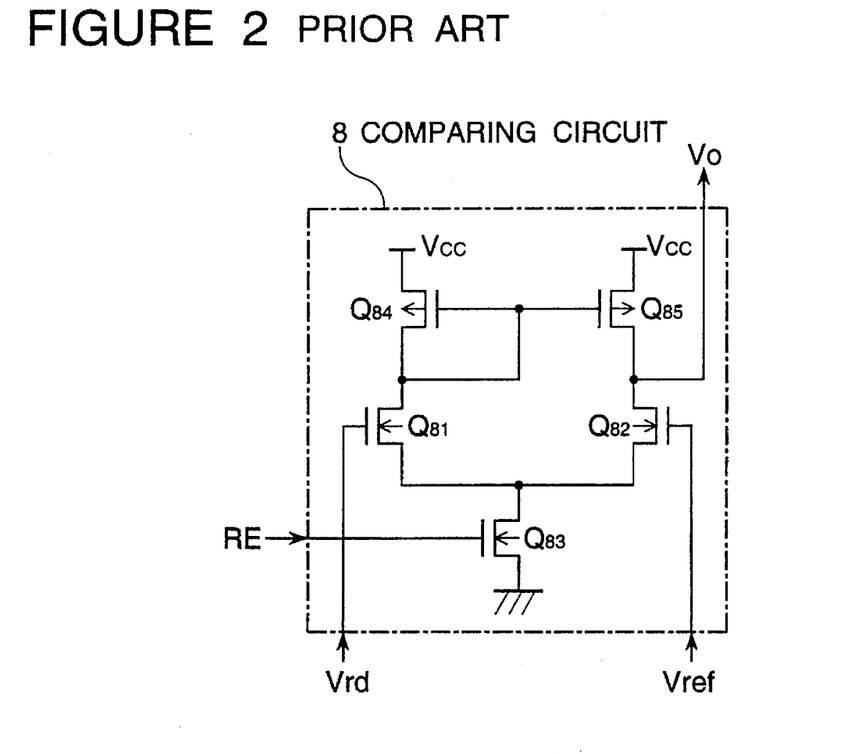
FIG. 2 is a circuit diagram illustrating a circuit diagram of the comparing circuit used in the nonvolatile semiconductor memory shown in FIG. 1.

As shown in FIG. 2 illustrating a circuit diagram of the comparing circuit 8, the comparing circuit 8 includes transistors Q81 to Q85 connected as shown. In brief, the transistors Q81 and Q82 are connected in the form of a differential circuit. A gate of the transistor Q81 is connected to receive the read-out voltage Vrd, and a gate of the transistor Q82 is connected to receive the reference voltage Vref. A source of the transistors Q81 and Q82 is connected in common to a drain of the transistor Q83, which in turn has a source connected to the ground and a gate connected to receive the read control signal (read enable signal) RE. Respective drains of the transistors Q81 and Q82 are connected to the power supply voltage Vcc through the transistors Q84 and Q85, respectively, which are connected to constitute a current mirror type load circuit. With this arrangement, when the read control signal RE is at an active level, the comparing circuit 8 compares the signal level Vrd on the selected bit line with the reference voltage Vref.

Now, an operation of the nonvolatile semiconductor memory as mentioned above will be described.

When the write control signal (program enable signal) PE is at an active level, the voltage generating circuit 7X generates the first, second and third predetermined voltages V1, V2 and V3 set for the writing, which are supplied to the word line selected by the row decoder 2, the column decoder 3 and the bit line selected by the column decoder 3 and the bit line selecting circuit 4, so that a high voltage is applied between the control gate and the drain of the memory cell transistor positioned at an intersection between the selected word line and the selected bit line, with the result that electrons are extracted from the floating gate of the selected memory cell transistor by action of a tunnel effect so that the selected memory cell transistor is brought into a written condition. In this written condition, the threshold of the memory cell transistor becomes low, so that when a voltage for the read operation is applied to the control gate of the memory cell transistor, the memory cell transistor is brought into an on condition. This condition of the memory cell transistor will be called a "on-cell condition" hereinafter.

When the erase control signal (erase enable signal) EE is at an active level, the voltage generating circuit 7X generates the first, second and third predetermined voltages V1, V2 and V3 set for the erasing, which are supplied to the word line selected by the row decoder 2, the column decoder 3, and the bit line selected by the column decoder 3 and the bit line selecting circuit 4, respectively, so that a high voltage opposite in polarity to the writing voltage is applied between the control gate and the drain of the memory cell transistor positioned at an intersection between the selected word line and the selected bit line, with the result that electrons are injected into the floating gate of the selected memory cell transistor by action of the tunnel effect so that the selected memory cell transistor is brought into an erased condition. In this erased condition, the threshold of the memory cell transistor becomes high, so that when a voltage for the read operation is applied to the control gate of the memory cell transistor, the memory cell transistor is maintained in an off condition. This condition of the memory cell transistor will be called a "off-cell condition" hereinafter.

When the read control signal (read enable signal) RE is at an active level, the voltage generating circuit 7X generates a voltage for the reading, which is supplied to the word line selected by the row decoder 2. The bit line selected by the column decoder 3 and the bit line selecting circuit 4, is supplied with the power supply voltage Vcc through the load circuit 5. In this read operation, namely, the third predetermined voltage V3 is not generated. On the other hand, in the reference voltage generating circuit 6X, the control gate of the dummy cell DMC and the gate of the transistor Q61 are with a selection level voltage supplied in the reading operation (power supply voltage Vcc), so that the dummy cell DMC is ceaselessly in a selected condition, namely, in the reading operation condition. Furthermore, the power supply voltage Vcc is supplied to the transistor Q61 and the dummy transistor DMC, so that the reference voltage Vref is outputted from the node N2 of the reference voltage generating circuit 6X.

As mentioned above, the reference voltage Vref is at the intermediate level between the read-out level of the memory cell transistor in the on-cell condition and the read-out level of the memory cell transistors in the off-cell condition. On the other hand, if the selected memory cell transistor is in the on-cell condition, the voltage of the selected bit line and hence the node N1 drops to the ground potential, and on the other hand, if the selected memory cell transistor is in the off-cell condition, the voltage of the selected bit line and hence the node N1 is caused to elevate to the power supply voltage Vcc. Accordingly, by comparing the voltage Vrd of the selected bit line with the reference voltage Vref, the content stored in the selected memory cell transistor can be discriminated.

With repetition of the write operation and the erase operation, the characteristics of the memory cell transistors MC11 to MCmn is deteriorated because of the high voltage applied between the control gate and the drain in these operations. In particular, the read-out voltage Von in the on-cell condition is deteriorated, specifically, elevates, with the total number of write operations and erase operations, which will be simply called the "write/erase number" hereinafter. On the other hand, the control gate of the dummy cell DMC is ceaselessly applied with a power supply voltage Vcc which is at a constant level, so that the characteristics of the dummy cell is not deteriorated. Accordingly, the reference voltage Vref is ceaselessly at a constant.

Figure 3:
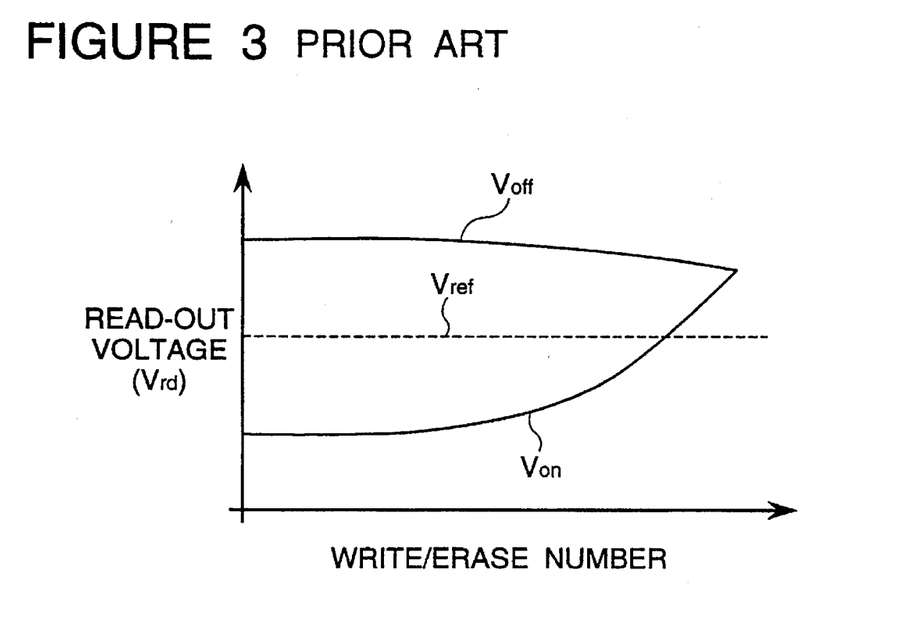
FIG. 3 is a graph showing the change, with the write/erase number, of the read-out voltage Von in the on-cell condition and the read-out voltage Voff in the off-cell condition, in comparison with the reference voltage Vref, in the nonvolatile semiconductor memory shown in FIG. 1.

This relation is illustrated in FIG. 3, which shows the change, with the write/erase number, of the read-out voltage Von in the on-cell condition and the read-out voltage Voff in the off-cell condition, in comparison with the reference voltage Vref.

As shown in FIG. 3, if the write/erase number becomes large, the read-out voltage Von in the on-cell condition becomes higher than the reference voltage Vref, so that it is no longer possible to discriminate whether it is in the on condition or in the off condition.

In order to overcome this problem, Japanese Patent Application Laid-open Publication No. JP-A-6-203585 has proposed that the dummy cell DMC is caused to be deteriorated similarly to the memory cell transistors (MC11 to MCmn) so that the reference voltage is caused to change with the write/erase number.

Figure 4:
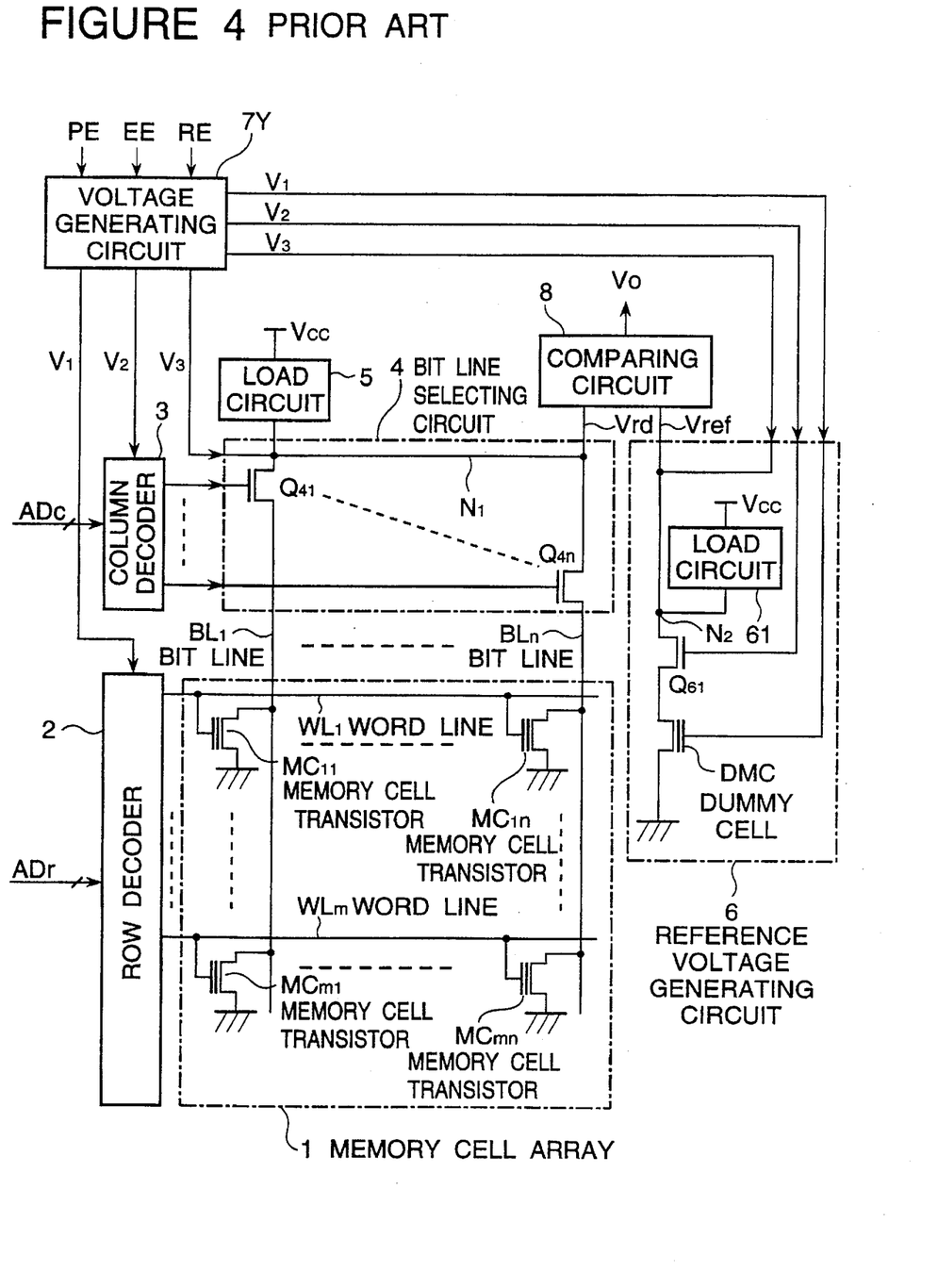
FIG. 4 is a circuit diagram of a second typical prior art example of the nonvolatile semiconductor memory.

Referring to FIG. 4, there is shown a circuit diagram of a prior art example of the nonvolatile semiconductor memory constructed as mentioned just above, which will be called a second typical prior art example. In FIG. 4, elements similar to those shown in FIG. 1 are given the same Reference Numerals, and explanation thereof will be omitted for simplification of the description.

As seen from comparison between FIGS. 1 and 4, the second typical prior art example of the nonvolatile semiconductor memory is so configured that, in the write operation and in the erase operation, a voltage generating circuit 7Y generates the first, second and third predetermined voltages V1, V2 and V3, which are supplied not only to the memory cell transistors MC11 to MCmn, the column decoder 3 and the connection node N1 of the transistors Q41 to Q4n of the bit line selecting circuit 4, but also to the control gate of the dummy cell DMC, the gate of the transistor Q61 and the connection node N2 in a reference voltage generating circuit 6, respectively.

Figure 5:
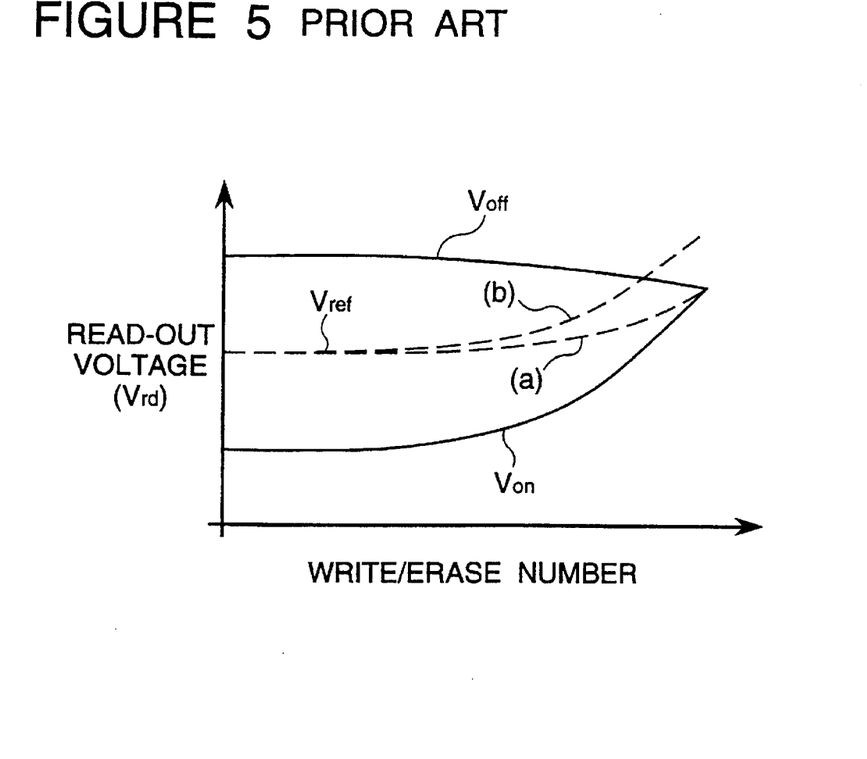
FIG. 5 is a graph showing the change, with the write/erase number, of the reference voltage Vref in the nonvolatile semiconductor memory shown in FIG. 4, in comparison with the read-out voltage Von in the on-cell condition and the read-out voltage Voff in the off-cell condition.

With this arrangement, the characteristics of the dummy cell DMC is deteriorated with the write/erase number, so that it is expected that the reference voltage Vref changes as shown by the dotted curved line (a) in FIG. 5, which shows the change, with the write/erase number, of the reference voltage Vref in the second prior art example, in comparison with the read-out voltage Von in the on-cell condition and the read-out voltage Voff in the off-cell condition.

Accordingly, it is expected to be possible to increase the write/erase number, by which the on-cell condition and the off-cell condition of the memory cell transistors MC11 to MCmn can be discriminated. Namely, the working life of the memory can be lengthened.

In this second prior art example, at each time the memory cell transistor write or erase operation is carried out, the write or erase operation is carried out for the dummy cell DMC. In fact, however, in one write or erase operation, all of the memory cell transistors MC11 to MCmn are not necessarily selected. As a result, the write/erase number of the dummy cell DMC becomes larger than the write/erase number of each of the memory cell transistors MC11 to MCmn, so that, as shown by the dotted curved line (b) in FIG. 5, the deterioration of the dummy cell DMC is earlier than that of the memory cell transistors. As a result, the write/erase number until it becomes impossible to discriminate the on-cell condition and the off-cell condition, becomes small, similarly to the first prior art example.

Figure 6:
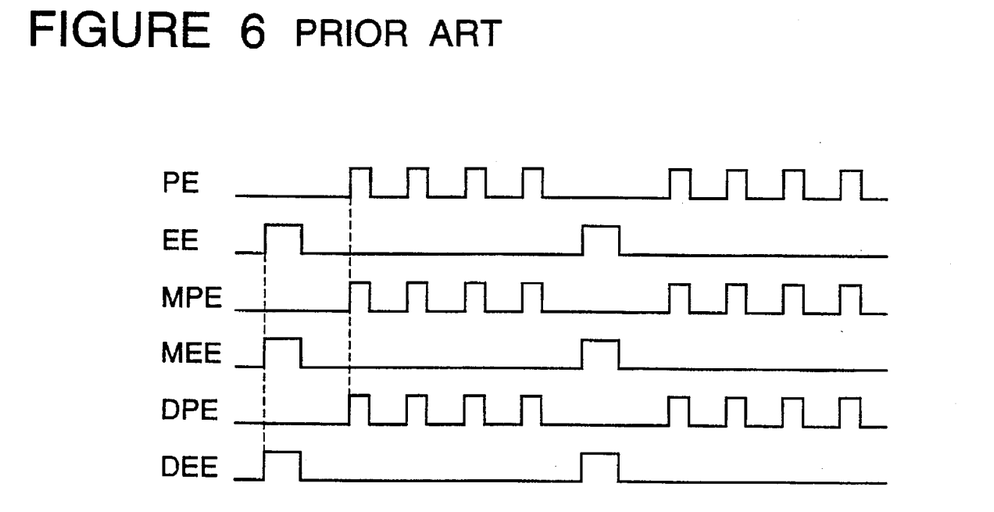
FIG. 6 is a timing chart illustrating the write operations and the erase operation sequentially carried out for a flash memory.

Furthermore, in a flash memory, as shown in FIG. 6, for each one erase operation, a plurality of discrete write operations are successively carried out for a plurality of memory cell transistors. In FIG. 6, Reference characters "MPE" and "MEE" designate the write control signal and the erase control signal for the memory cell transistors, respectively, and Reference characters "DPE" and "DEE" designate the write control signal and the erase control signal for the dummy cell, respectively. In the second prior art example shown in FIG. 4, at each time the write operation is carried for a different memory cell transistor, the write operation for the dummy cell is carried out. Accordingly, the write/erase amber until it becomes impossible to discriminate the on-cell condition and the off-cell condition, becomes small, similarly.

In order to overcome this problem, the above referred JP-A-6-203585 has also proposed to provide a counter for counting the write/erase number, and on the other hand, to estimate the deterioration of the memory cell transistors, so that the write/erase number of the dummy cell is reduced on the basis of this estimation. This will be called a third prior art example.

Incidentally, the prior art examples shown in FIGS. 1 and 4 have been so constructed that the write operation and the erase operation are performed by applying the high voltage between the control gate and the drain of the memory cell transistors. However, it can be so constructed that the write operation and the erase operation are performed by applying the high voltage between the control gate and the source of the memory cell transistors.

In summary, the first prior art example of the nonvolatile semiconductor memory has been so constructed that the constant reading voltage (power supply voltage Vcc) is ceaselessly applied to the control gate of the dummy cell DMC of the reference voltage generating circuit, regardless of the write/erase operation for the memory cell transistors MC11 to MCmn, so that a constant reference voltage Vref is generated at any time. However, the characteristics of the memory cell transistors MC11 to MCmn is deteriorated with increase in the write/erase number, so that it ultimately becomes impossible to discriminate the on-cell condition and the off-cell condition in the read operation.

The second prior art example of the nonvolatile semiconductor memory has been so constructed that, at each write operation for the memory cell transistors MC11 to MCmn (including a plurality of successive operations for applying the write voltages to different memory cell transistors) and at each erase operation, the write operation (including a plurality of successive operations for applying the write voltage) and the erase operation are carried out for the dummy cell. Therefore, the characteristics of the dummy cell is deteriorated together with the memory cell transistors MC11 to MCmn. However, since in each write operation some number of memory cell transistors are not selected, the characteristics of the dummy cell is deteriorated rather earlier than the memory cell transistors MC11 to MCmn, with the result that the write/erase number by which it is still possible to discriminate the on-cell condition and the off-cell condition, becomes small, similarly to the first prior art example.

The third prior art example of the nonvolatile semiconductor memory has been so constructed that, the write/erase number is counted by the counter, and on the other hand, the deterioration of the memory cell transistors is estimated, so that the write/erase number of the dummy cell is reduced on the basis of the estimation of the deterioration of the memory cell transistors. This third prior art example should be able to overcome the problem of the second prior art example. However, the estimation of the deterioration of the memory cell transistors needs an extremely long verification term. In addition, since there is inevitably a variation in a manufacturing process, the estimation of the deterioration is difficult.

SUMMARY OF THE INVENTION

Accordingly, it is an object of the present invention to provide a nonvolatile semiconductor memory which has overcome the above mentioned defects of the conventional ones.

Another object of the present invention is to provide a nonvolatile semiconductor memory having a reference voltage generating circuit including a dummy cell therein and so configured to be able to make the degree of deterioration of the dummy cell close to the degree of deterioration of memory cell transistors, thereby lengthening the working life of the nonvolatile semiconductor memory.

The above and other objects of the present invention are achieved in accordance with the present invention by an nonvolatile semiconductor memory comprising:

a memory cell array composed of a number of electrically erasable programmable memory cell transistors arranged to form a matrix having a plurality of rows and a plurality of columns;

a plurality of word lines each provided for a corresponding one of the rows of the memory cell transistors and each connected in common to a control gate of the memory cell transistors included in the corresponding row;

a plurality of bit lines each provided for a corresponding one of the columns of the memory cell transistors and each connected in common to a drain of the memory cell transistors included in the corresponding column;

a common source line connected to sources of the memory cell transistors;

a row decoder receiving a first predetermined voltage and a row address signal in each of various operations including a write operation, an erase operation and a read operation, for selecting from the plurality of word lines a word line in accordance with the received row address signal and for supplying the received first predetermined voltage to the selected word line;

a bit line selecting circuit having a plurality of first switching transistors connected between the plurality of bit lines and a first connection node, respectively;

a column decoder receiving a second predetermined voltage and a column address signal in the various operations, for selectively supplying the received second predetermined voltage to only one of the first switching transistors in accordance with the received column address signal so as to rum on the selected only one first switching transistor while maintaining the others of the first switching transistors in an off condition, so that the bit line designated by the received column address signal is connected through the selectively turned-on first switching transistor to the first connection node;

a first voltage generating circuit for supplying the first predetermined voltage, the second predetermined voltage and a third predetermined voltage, which are determined in accordance with a designated operation of the various operations, and which are supplied to the row decoder, the column decoder, and the first connection node, respectively;

a reference voltage generating circuit having a second connection node for generating a reference voltage, which is an intermediate level between a read-out level of the memory cell transistors in an on condition and a read-out level of the memory cell transistors in an off condition, the reference voltage generating circuit including a dummy cell and a second switching transistor which are connected in series between the common source line and the second connection node, the dummy cell having the same characteristics as that of the memory cell transistors, excepting that the dummy cell has an on-resistance different from that of the memory cell transistors, the second switching transistor having the same characteristics as that of the first switching transistor, so that when a control gate of the dummy cell and a gate of the second switching transistor receive respective voltages;

a comparing circuit for comparing the reference voltage with a signal level appearing on the first connection node, in the read operation; and a second voltage generating circuit for supplying the first predetermined voltage, the second predetermined voltage and the third predetermined voltage, which are also determined in accordance with a designated operation of the various operations, to a control gate of the dummy cell, a gate of the second switching transistor and the second connection node, respectively, the second voltage generating circuit supplying the first predetermined voltage, the second predetermined voltage and the third predetermined voltage, one time for each one occurrence of the dummy cell erasing voltage.

In one embodiment, the first voltage generating circuit sequentially generates a plurality of sets of the first predetermined voltage, the second predetermined voltage and the third predetermined voltage, in the write operation after the erase operation has been performed, and the second voltage generating, circuit generates one set of the first predetermined voltage, the second predetermined voltage and a third predetermined voltage, in synchronism with a first one set of the plurality of sets of the first predetermined voltage, the second predetermined voltage and the third predetermined voltage which are generated in the first voltage generating circuit.

In another embodiment, the second voltage generating circuit generates one set of the first predetermined voltage, the second predetermined voltage and the third predetermined voltage for writing the dummy cell, one time just after generation of one set of the first predetermined voltage, the second predetermined voltage and the third predetermined voltage for erasing the dummy cell.

As seen from the above, the second voltage generating circuit for supplying various voltages to the dummy cell in the various operations is provided in addition to the first voltage generating circuit for supplying various voltages to the memory cell transistors in the various operations. The second voltage generating circuit is configured to supply a dummy cell writing voltage to the dummy cell, one time only when the erase operation for the memory cell transistors has been carried out. Accordingly, with a very simple construction, the progress of the deterioration of the dummy cell and the memory cell transistor can be made close to each other, so that the working life of the nonvolatile semiconductor memory can be lengthened.

The above and other objects, features and advantages of the present invention will be apparent from the following description of preferred embodiments of the invention with reference to the accompanying drawings.

DESCRIPTION OF THE PREFERRED EMBODIMENTS

Figure 7:
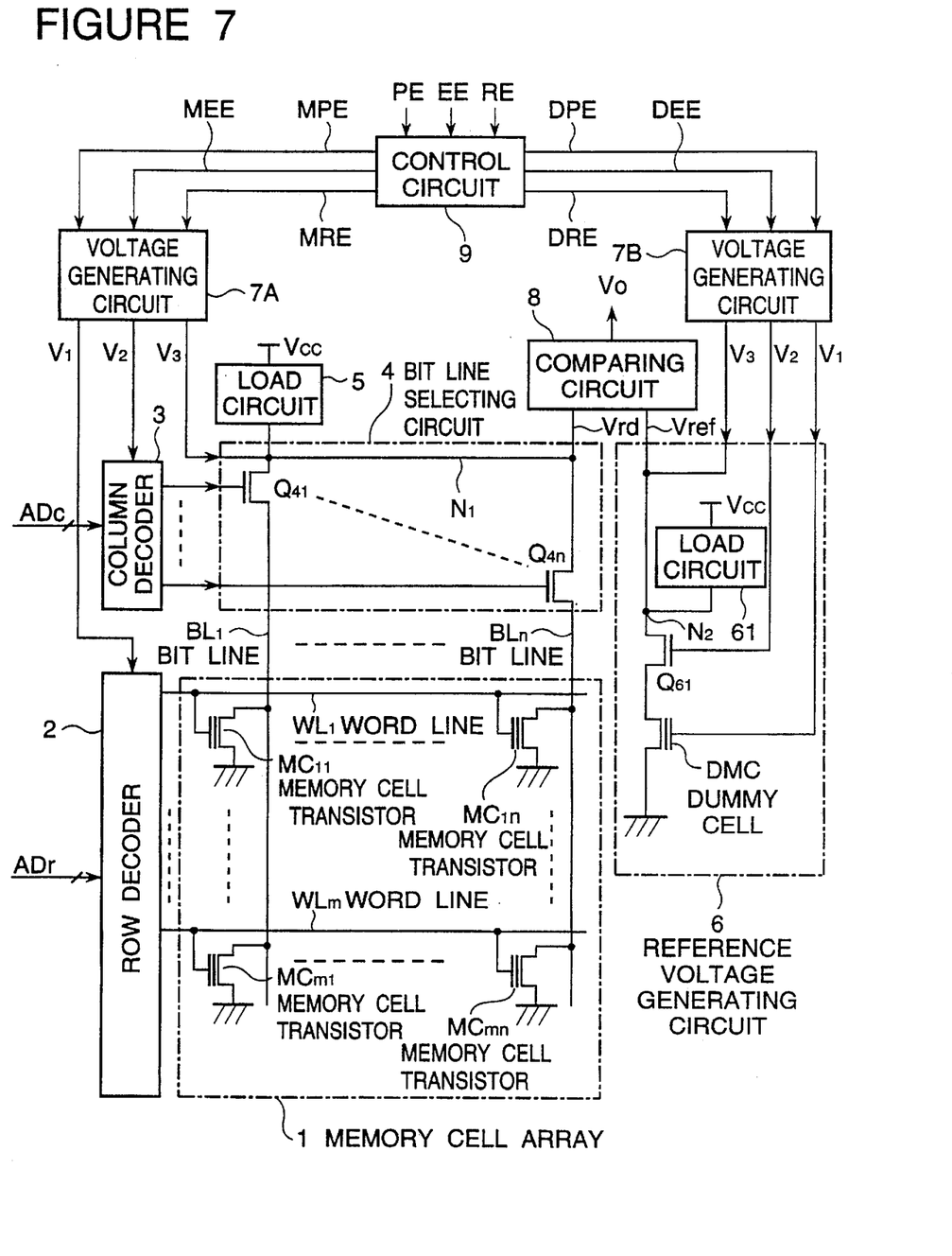
FIG. 7 is a circuit diagram of an embodiment of the nonvolatile semiconductor memory in accordance with the present invention.

Referring to FIG. 7, there is shown a circuit diagram of an embodiment of the nonvolatile semiconductor memory in accordance with the present invention. In FIG. 7, elements similar to those shown in FIG. 4 are given the same Reference Numerals, and explanation thereof will be omitted for simplification of the description.

As seen from comparison between FIGS. 4 and 7, the shown embodiment is different from the second prior art example shown in FIG. 4, in that the shown embodiment includes a control circuit 9 receiving the write control signal PE, the erase control signal EE and the read control signal RE, for generating a memory cell write control signal MPE, a memory cell erase control signal MEE and a memory cell read control signal MRE in synchronism with the write control signal PE, the erase control signal EE and the read control signal RE, respectively, and also for generating a dummy cell erase control signal DEE and a dummy cell read control signal DRE in synchronism with the erase control signal EE and the read control signal RE, respectively, and a dummy cell write control signal DPE in synchronism with a first write control signal of a plurality of write control signals PE successively generated after the erase control signal EE.

Furthermore, the shown embodiment includes, in place of the voltage generating circuit 7Y in the second prior art example, a first voltage generating circuit 7A receiving the memory cell write control signal MPE, the memory cell erase control signal MEE and the memory cell read control signal MRE, for supplying the first, second and third predetermined voltages V1, V2 and V3 required for each operation to the row decoder 2, the column decoder 3 and the node N1 of the bit line selecting circuit 4, and a second voltage generating circuit 7B receiving the dummy cell write control signal. DPE, the dummy cell erase control signal DEE and the dummy cell read control signal DRE, for supplying the fast, second and third predetermined voltages V1, V2 and V3 required for each operation to the reference voltage generating circuit 6.

Accordingly, the control for supplying the first, second and third predetermined voltages V1, V2 and V3 to the memory cell transistors MC11 to MCmn is carried out independently of the control for supplying the first, second and third predetermined voltages V1, V2 and V3 to the reference voltage generating circuit 6 including the dummy cell DMC.

Figure 8:
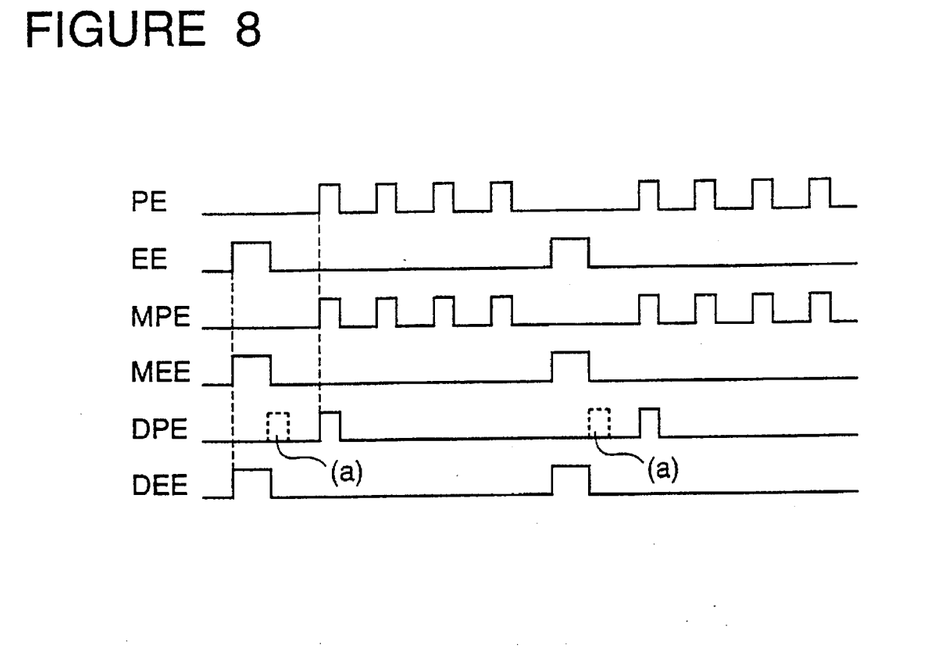
FIG. 8 is a timing chart illustrating the write operations and the erase operation sequentially carried out for the flash memory in accordance with the present invention.

Now, an operation of the shown embodiment will be described with a timing chart of FIG. 8 illustrating the timing of various control signals in the shown embodiment.

When the erase control signal EE is supplied to the control circuit 9, the control circuit 9 generates the memory cell erase control signal MEE and the dummy cell erase control signal DEE in synchronism with the erase control signal EE. The memory cell erase control signal MEE and the dummy cell erase control signal DEE are supplied to the first and second voltage generating circuits 7A and 7B, respectively.

The first and second voltage generating circuits 7A and 7B generate the first, second and third predetermined voltages V1, V2 and V3 which are required and determined for the erase operation and which are supplied to the row decoder 2, the column decoder 3, the bit line selecting circuit 4 and the reference voltage generating circuit 6, respectively. Thus, the erase operation is performed for the memory cell transistors MC11 to the MCmn and the dummy cell DMC.

After the erase operation, if the write control signal PE is supplied to the control circuit 9, the control circuit 9 generates, in synchronism with each write control signal PE, the memory cell write control signal MPE to the first voltage generating circuit 7A. In synchronism with each memory cell write control signal MPE, the first voltage generating circuit 7A generates the first, second and third predetermined voltages V1, V2 and V3 required and determined for the write operation, to the row decoder 2, the column decoder 3 and the bit line selecting circuit 4, so that the write operation is carried out for a selected one of the memory cell transistors MC11 to MCmn.

On the other hand, the control circuit 9 generates one dummy cell write control signal DPE in synchronism with only a first write control signal of a plurality of write control signals PE successively generated after the erase control signal EE. The one dummy cell write control signal DPE is supplied to the second voltage generating circuit 7B, which in turn generates the first, second and third predetermined voltages V1, V2 and V3 required and determined for the write operation. The first, second and third predetermined voltages V1, V2 and V3 are supplied to the reference voltage generating circuit 6 so that the write operation is carried out for the dummy cell. However, no write operation for the dummy cell DMC is carried out in synchronism with a second and succeeding write control signals of the plurality of write control signals PE successively generated after the erase control signal EE.

Figure 9:
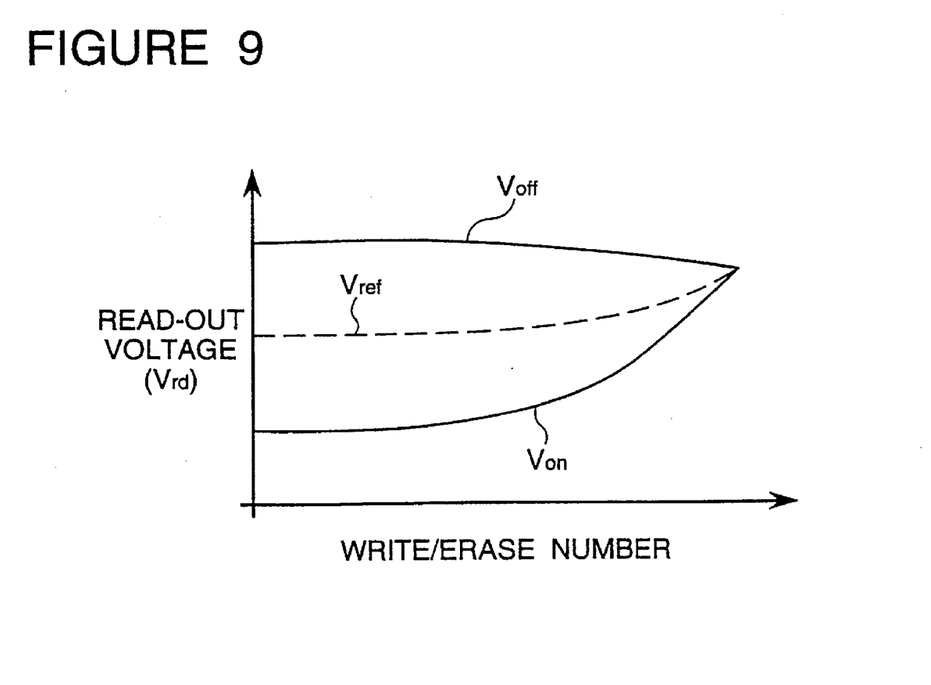
FIG. 9 is a graph showing the change, with the write/erase number, of the reference voltage Vref in the nonvolatile semiconductor memory in accordance with the present invention, in comparison with the read-out voltage Von in the on-cell condition and the read-out voltage Voff in the off-cell condition.

Thus, the write/erase number of the dummy cell DMC can be made substantially equal to the write/erase number of each of the memory cell transistors MC11 to MCmn. Accordingly, the progress of the deterioration of the dummy cell DMC and the memory cell transistor can be made close to each other. For example, as shown in FIG. 9, the dotted curved line of the reference voltage Vref changing with the write/erase number can be caused to pass on an intersecting point between the curved line of the read-out voltage Von in the on-cell condition and the curved line of the read-out voltage Voff in the off-cell condition. Thus, the working life of the nonvolatile semiconductor memory can be maximized.

In the above mentioned embodiment, the dummy cell write control signal DPE is generated in synchronism with the first occurring write control signal PE after the erase operation, as shown in the solid line in FIG. 8. However, the dummy cell write control signal DPE can be generated just after the erase control signals EE, MEE and DEE, regardless of the generation of the write control signals PE and MPE, as shown in a dotted line designated by Reference Character "a" in FIG. 8, As seen from the above, the nonvolatile semiconductor memory in accordance with the present invention is characterized in that, the control for generating the various voltages supplied to the dummy cell in each operation is performed independently of that for the memory cell transistors in such a manner that, only after the erase operation has been carried out, only one write operation is performed for the dummy cell. Therefore, with a very simple construction, the progress of the deterioration of the dummy cell and the memory cell transistor can be made close to each other, so that the working life of the nonvolatile semiconductor memory can be lengthened.

The invention has thus been shown and described with reference to the specific embodiments. However, it should be noted that the present invention is in no way limited to the details of the illustrated structures but changes and modifications may be made within the scope of the appended claims.

We claim:

1. A nonvolatile semiconductor memory comprising:

a memory cell array composed of a number of electrically erasable programmable memory cell transistors arranged along a plurality of word lines and along a plurality of bit lines;

a row decoder receiving a row address signal, for selecting from said plurality of word lines one word line in accordance with the received row address signal;

a bit line selecting circuit and column decoder receiving a column address signal, for selecting from said plurality of bit lines one bit line in accordance with the received column address signal;

a first voltage generating circuit for supplying said row decoder and said bit line selection circuit and column decoder with a set of memory cell writing voltages in a write operation, a set of memory cell reading voltages in a read operation, and a set of memory cell erasing voltage in an erase operation, respectively;

a reference voltage generating circuit including a dummy cell, for generating a reference voltage, which is an intermediate level between a read-out level of said memory cell transistors in an on condition and a read-out level of said memory cell transistors in an off condition, said dummy cell having the same characteristics as that of said memory cell transistors, excepting that said dummy cell has an on-resistance different from that of said memory cell transistors;

a comparing circuit for comparing said reference voltage with a signal outputted from said bit line selection circuit and column decoder, in the read operation; and a second voltage generating circuit for supplying a set of dummy cell reading voltages to said reference voltage generating circuit in said read operation a set of dummy cell erasing voltages to said reference voltage generating circuit in said erase operation, respectively, said second voltage generating circuit also supplying a set of dummy cell writing voltages to said reference voltage generating circuit, one time for each one occurrence of said set of dummy cell erasing voltages.

2. A nonvolatile semiconductor memory claimed in claim 1 wherein said first voltage generating circuit sequentially generates a plurality of sets of memory cell writing voltages in said write operation after said set of memory cell erasing voltages are generated in said erase operation, and said second voltage generating circuit generates said set of dummy cell writing voltages in synchronism with a first one of said plurality of sequentially generated memory cell writing voltages.

3. A nonvolatile semiconductor memory claimed in claim 1 wherein said second voltage generating circuit generates said set of dummy cell writing voltages, one time just after generation of said set of dummy cell erasing voltages.

4. A nonvolatile semiconductor memory comprising:

a memory cell array composed of a number of electrically erasable programmable memory cell transistors arranged to form a matrix having a plurality of rows and a plurality of columns;

a plurality of word lines each provided for a corresponding one of said rows of said memory cell transistors and each connected in common to a control gate of the memory cell transistors included in the corresponding row;

a plurality of bit lines each provided for a corresponding one of said columns of said memory cell transistors and each connected in common to a drain of the memory cell transistors included in the corresponding column;

a common source line connected to sources of said memory cell transistors;

a row decoder receiving a first predetermined voltage and a row address signal in each of various operations including a write operation, an erase operation and a read operation, for selecting from said plurality of word lines a word line in accordance with the received row address signal and for supplying the received first predetermined voltage to the selected word line;

a bit line selecting circuit having a plurality of first switching transistors connected between said plurality of bit lines and a first connection node, respectively;

a column decoder receiving a second predetermined voltage and a column address signal in said various operations, for selectively supplying the received second predetermined voltage to only one of said first switching transistors in accordance with the received column address signal so as to turn on the selected only one first switching transistor while maintaining the others of said first switching transistors in an off condition, so that the bit line designated by said received column address signal is connected through the selectively turned-on first switching transistor to said first connection node;

a first voltage generating circuit for supplying said first predetermined voltage, said second predetermined voltage and a third predetermined voltage, which are determined in accordance with a designated operation of said various operations, and which are supplied to said row decoder, said column decoder, and said first connection node, respectively;

a reference voltage generating circuit having a second connection node for generating a reference voltage, which is an intermediate level between a read-out level of said memory cell transistors in an on condition and a read-out level of said memory cell transistors in an off condition, said reference voltage generating circuit including a dummy cell and a second switching transistor which are connected in series between said common source line and said second connection node, said dummy cell having the same characteristics as that of said memory cell transistors, excepting that said dummy cell has an on-resistance different from that of said memory cell transistors, said second switching transistor having the same characteristics as that of said first switching transistor, so that when a control gate of said dummy cell and a gate of said second switching transistor receive respective voltages;

a comparing circuit for comparing said reference voltage with a signal level appearing on said first connection node, in the read operation; and a second voltage generating circuit for supplying said first predetermined voltage, said second predetermined voltage and said third predetermined voltage, which are also determined in accordance with a designated operation of said various operations, to a control gate of said dummy cell, a gate of said second switching transistor and said second connection node, respectively, said second voltage generating circuit supplying said first predetermined voltage, said second predetermined voltage and said third predetermined voltage, one time for each one occurrence of said dummy cell erasing voltage.

5. A nonvolatile semiconductor memory claimed in claim 4 wherein said first voltage generating circuit sequentially generates a plurality of sets of said first predetermined voltage, said second predetermined voltage and said third predetermined voltage, in said write operation after said erase operation has been performed, and said second voltage generating circuit generates one set of said first predetermined voltage, said second predetermined voltage and a third predetermined voltage, in synchronism with a first one set of said plurality of sets of said first predetermined voltage, said second predetermined voltage and said third predetermined voltage which are generated in said first voltage generating circuit.

6. A nonvolatile semiconductor memory claimed in claim 4 wherein said second voltage generating circuit generates one set of said first predetermined voltage, said second predetermined voltage and said third predetermined voltage for writing said dummy cell, one time just after generation of one set of said first predetermined voltage, said second predetermined voltage and said third predetermined voltage for erasing said dummy cell.

* * * * *